United States Patent [19]

Frey

[11] Patent Number: 4,788,539
[45] Date of Patent: Nov. 29, 1988

[54] DIGITAL DISPLAY DEVICE

[76] Inventor: Roger G. Frey, P.O. Box 1458, New Haven, Conn. 06506

[21] Appl. No.: 907,234

[22] Filed: Sep. 15, 1986

[51] Int. Cl.[4] .............................................. G09G 1/00
[52] U.S. Cl. ..................................... 340/753; 340/722; 340/52 R
[58] Field of Search ............... 340/753, 754, 722, 726, 340/52 R, 52 F, 724; 324/115

[56]  References Cited

U.S. PATENT DOCUMENTS

| | | | |
|---|---|---|---|
| 3,525,091 | 8/1970 | Lally | 340/75 3 |
| 3,594,757 | 7/1971 | Gard | 340/724 |
| 3,714,569 | 1/1973 | Bruning et al. | 324/115 |
| 4,247,843 | 1/1981 | Miller et al. | 340/724 |
| 4,283,723 | 8/1981 | Bickley et al. | 340/735 |
| 4,293,843 | 10/1981 | Bertoloni et al. | 340/52 F |
| 4,445,114 | 4/1984 | Stubben | 340/726 |
| 4,461,175 | 7/1984 | Baumgart et al. | 324/115 |
| 4,467,323 | 8/1984 | Kling et al. | 340/722 |
| 4,631,513 | 12/1986 | Teshing et al. | 340/52 R |

Primary Examiner—John W. Caldwell, Sr.
Assistant Examiner—Alvin Oberley
Attorney, Agent, or Firm—Edward R. Hyde

[57]  ABSTRACT

A digital device for visually displaying the value of a generally continuously varying function, such as car speed. The device displays subranges of a full scale, putting them individually in a viewing area. The displayed subranges in the viewing area will be replaced as required to permit representation of the input function over the full scale. The device allows selection of a new subrange with the property that the input function value initially will be at an interior position in the new subrange, thereby preventing repeated rapid switching between subranges. The subrange display can be defined using scale markers in just a few fixed positions in the viewing area.

8 Claims, 2 Drawing Sheets

DIGITAL DISPLAY DEVICE

BACKGROUND OF THE INVENTION

The present invention relates in general to devices that provide a visual display of the value of a generally continually varying function.

There are numerous applications for the visual display of numerical values. In particular, values of continuous or near-continuous mathematical functions often have to be displayed. Sound or voltage levels are examples of functions possibly having occasional discontinuities. Examples of devices used for the display of function values include speedometers, audio signal level meters, flowmeters, and voltmeters.

Mechanical devices, such as a meter using a needle and scale, have long been used for such displays. More recently, electronic devices with digital displays have been used. These usually employ integrated solid state electronics. The digital displays may show numerals representing the function value, or may show a simulation of an analog display (as with a bar display which can grow and shrink, or a display of a simulated indicator needle moving along a scale).

The electronic digital display (EDD devices have a number of advantages over the mechanical device such as cost, size, accuracy, readability, etc.

As a result of the various advantages, the EDD has been replacing the mechanical display in many applications. One highly visible place where this change is happening is on automobile dashboards, involving various readings, including car speed. The auto speedometer will be used as an example herein.

One obvious method of display of a quantity is a display of numerals, usually in decimal digits using the common seven-segment format for each digit. In a speedometer, a decimal number, say "43", would be displayed to indicate speed; this number changes as the speed changes. If higher precision is wanted, a decimal point and fraction digits may be added, such as "43.7".

There are a number of problems with this numeral display. First, a viewer glancing at the display must mentally decode the digits to understand the value displayed. This mental interpretation step may take a fraction of a second more time than viewing an analog needle or bar display. While this is a short time, it may be critical in some circumstances. With the analog display, there is repeated viewing against the same scale, so the scale does not require repeated decoding. One only needs to observe the change of the analog quantity, as through the needle movement or bar's size change.

Second, low-order digits may be changing rapidly, and may therefore be difficult to read. This is especially true when higher precision adds low-order digits, such as fraction digits.

Third, when the speed is just between two display values e.g. 99 and 100, the display may flicker between the two, again making the value hard or impossible to read correctly.

The flickering can be a distracting visual flashing. For example, five of seven segments are changing in a transition between a "1" and a "2" digit, and several digits may be changing simultaneously. This can be dangerous, as in the case of driving an automobile. An appropriate rate of flashing may even induce "flicker vertigo" in some people, and this can produce a trance-like state.

One approach to reduce the digit-changing and flicker problem is to build a delay into the display logic. This forces a display value to persist for a minimum period before a new value is displayed. The difficulty with this is that it prevents accurate display of current values. That is, there is a tradeoff between the visual stability of the display and it's currency.

A method that avoids the problems of numeral display is to use digital components to simulate the appearance of an analog meter. For example, a bar display, made with numerous display segments arranged in picket fence fashion that can be activated to produce a bar of varying length, can be used in conjunction with a scale. This pseudo-analog display allows rapid viewing, as compared to the digit decoding required in the above numeral display.

There are, however, difficulties with this bar display. First, it must be large enough to show the entire scale, as with the analog meter it simulates. This means more space is required for the display, it will weigh more, and in general the cost will be higher for the greater quantity of materials in the device. Second, the more precision is used to achieve a smooth simulation of an analog display, as with the number of segments in the bar display, the more costly the device will be.

One response to the problems of a full simulation of a mechanical meter with an EDD is to break the full scale into a set of adjacent subscales, only one of which is displayed at the time. For example, a 0 to 99 unit speedometer might be split into five subscales of twenty units each: 0-19, 20-39, etc. At any instant, the EDD display would select the subscale required to display the current input value, produce the appropriate display of the subscale, and display a simulated bar against the scale so as to show the current speed value.

A problem with this form of EDD is that if the input value hovers right between two subscales, there may be flashing between the two adjacent subscales. The above discussion of the flashing problem argues strongly against this form of display.

It is possible to retain the advantages of an EDD that uses subscales, yet avoids the flashing display problem and the present invention accomplishes this through the use of overlapping subscales. The display logic of the invention selects subscales so that it is impossible to have a situation where the input can hover near some value and force a flashing back and forth between subscales, as in the preceeding case.

Accordingly, it is an object of the present invention to provide an improved electronic digital display device responsive to a function that may be continually varying and that avoids certain disadvantages of prior art digital display devices.

Another object of the present invention is to provide a digital display device in which a subrange of the full range of values is displayed and the subrange display is appropriately changed with a change in value of the measured function.

A further object of the present invention is to provide an improved electronic digital display device which displays subranges of the full scale in which subrange changeovers cannot produce flashing multiple transitions, regardless of inputs and there is a smooth non-flashing transition between subrange changeovers.

These and other advantages of the present invention will become apparent from the following description of detailed embodiments thereof.

DESCRIPTION OF THE DRAWINGS

FIG. 1 comprising

FIG. 2 comprising

FIG. 3 comprising

FIG. 4 comprising

DESCRIPTION OF THE PREFERRED EMBODIMENTS

Figure 1A:
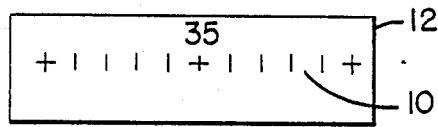
FIGS. 1A–1C illustrate embodiments of the subrange display of the present invention.
Figure 1B:
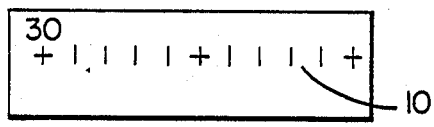
Figure 1C:
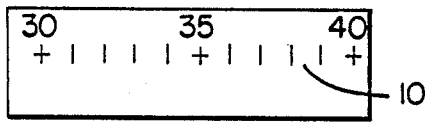

Referring now to the drawings, and more particularly to FIG. 1, there is shown alternative examples of a segment or subrange 10 of a scale within a viewing area 12. The full range of the scale may for example be from 0–100 with each subrange 10 covering 10 units. The subrange may be shown with a center value as in FIG. 1A, an end valve as in FIG. 1B, or center and end values as in FIG. 1C. Intermediate values are indicated by hash marks. The numbers may be shown by a standard digital display. Although the subrange displays 10 shown in the drawings are straight and horizontal, it is understood that they could be vertical, arcuate or of other arrangements.

Figure 2A:
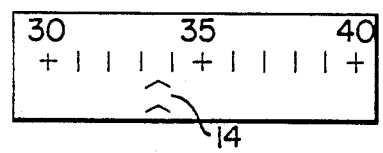
FIGS. 2A and 2B illustrate different forms of the value indicator.
Figure 2B:
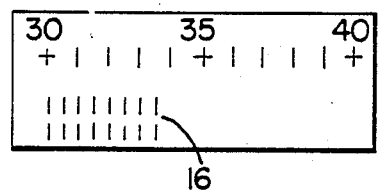

The precise value of the function being displayed would be shown by an indicator running the full length of the subrange. In FIG. 2A for example, the indicator is shown as hash marks 14 and in FIG. 2B as a bar display 16. The preferred form of the indicator would be an electronic, fine resolution display capable of simulating an analog bar. It is seen then that the subrange display in FIGS. 1 and 2 is stationary during it's appearance in the display area 12 and the indicator 14 or 16 shows movement with the changing analog value increasing from left to right.

Figure 3A:
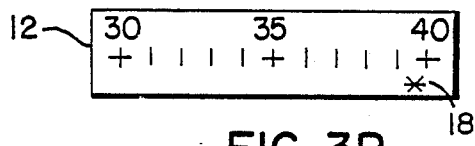
FIGS. 3A–3C shows an example of a display operation.
Figure 3B:
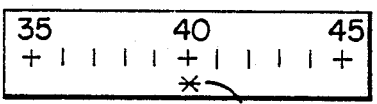
Figure 3C:
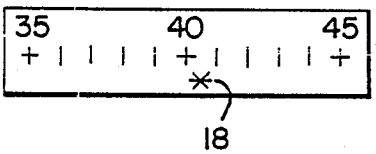

FIG. 3 illustrates an example of the operation of the device for a sequence of speeds 39.5, 40 and 40.5 In FIG. 3A, a subrange of 30–40 appears in the viewing area 12 and the indicator 18 shows a speed of 39.5 which is near the upper end of the subrange. As the speed reaches 40, a new subrange 35–45 is caused to appear in the viewing area. The important feature is that the subrange in FIG. 3B overlaps with the subrange of FIG. 3A. In the example shown, the overlap is manifested in the upper limit 40 of FIG. 3A being located at the center of the FIG. 3B subrange. Of course if the value had fallen to the lower end of the subrange, then the new subrange to appear in the viewing area would be 25–35 with 30 as the center value. It is seen that with the overlap in range between two successive subranges, the tendency for end range transition flicker is eliminated. Thus the value may increase to 40.5 and the indicator 18 simply moves upscale without any changeover to a new subrange.

Figure 4A:
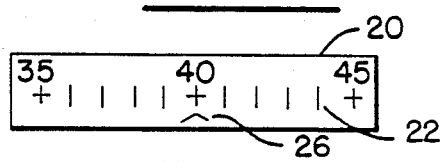
FIGS. 4A and 4B show another embodiment of the invention in which the subrange scale is movable.
Figure 4B:
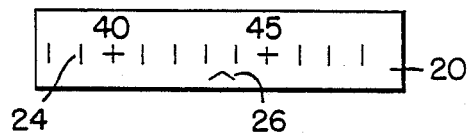

Another embodiment of the invention contemplates a subrange scale that is movable in relation to a fixed indicator. FIGS. 4A and B illustrate a viewing area 20 showing subranges 22 and 24 respectively and a fixed indicator 26. It is understood that the subrange moves in response to the varying analog function being monitored. In FIG. 4A, the value 40 is shown adjacent the indicator and in FIG. 4B the value 43.5.

Figure 5:
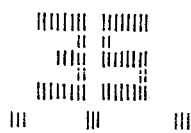
FIG. 5 shows details of a digit and hash marks.

A detail of the digits and hash marks are shown in FIG. 5.

Figure 6:
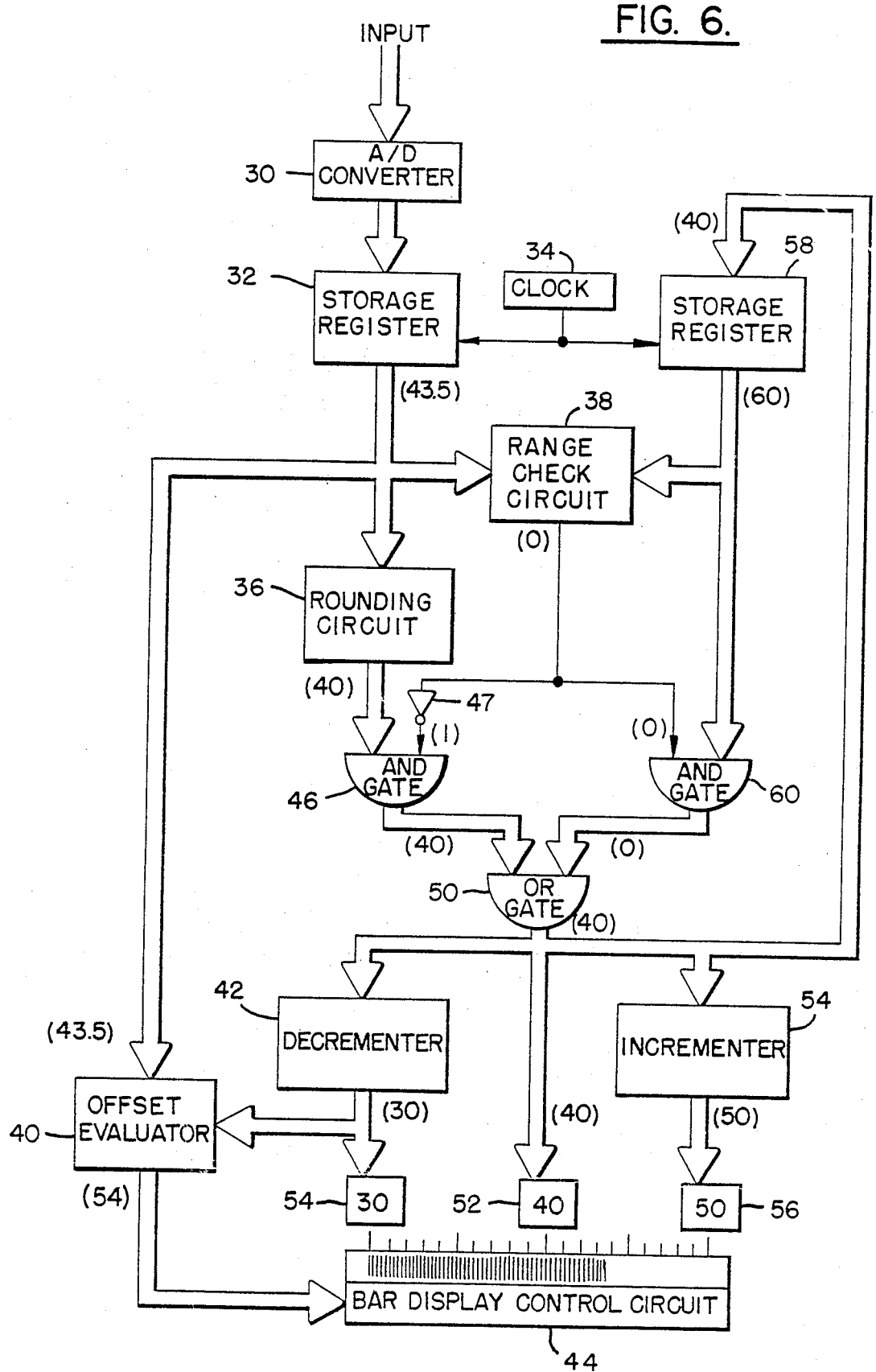
FIG. 6 is a schematic block diagram of an embodiment of the invention with the numbers of a numerical example shown in parentheses.

Referring now to FIG. 6, there is shown a schematic block diagram of a system for controlling the subrange display and indicator of one embodiment of the present invention.

This embodiment by way of example contemplates a fixed subrange scale displaying the scale end and center values as in FIG. 1C. The varying value is displayed by a bar as in FIG. 2B in which it is assumed that four bar slices is equal to one unit value. It is understood that the system must insure that the correct subrange is displayed corresponding to the instantaneous value of the monitored function. Also, the bar must accurately represent the varying value.

The system will be explained for an input value of (43.5) to be displayed.

The analog input of a function that may be continually varying is passed to an analog-to-digital converter 30, the digital output I of which connects to storage register 32. It is understood that the varying function may contain discontinutie and that these will not detract from the accurate display of the function by the present invention. The latter receives latch pulses from clock 34 and in the example considered the input value (43.5) is latched and passed to a rounding circuit 36, range check circuit 38 and offset evaluator 40.

The offset evaluator performs certain arithmetical functions. It receives a value from the decrementer 42 which in the example is (30), representing the number displayed at the low end of the subrange. The unit 40 subtracts the low subrange number from the input whole number value, obtaining a result of 13 which represents the magnitude of the value (excluding the fraction) above the low subrange end 30. Because there are four slices of the bar to a unit, the evaluator multiplies the value thirteen by four to obtain fiftytwo. The evaluator 40 also converts the fractional part of the value to the appropriate number of slices. Here the fractional part of the value is 0.5 which would be represented by two slices. Thus the unit 40 will perform the addition of Fifty-two plus two, which value Fifty-four is passed to the bar display control circut 44.

It is seen then that the offset evaluator performed the following arithmetic functions:

4 (I whole number−subrange low end)+fraction in slices or $$4(43-30)+2=54$$

The output (40) from the rounding circuit is passed to AND gate 46 which, if it also receives an output pulse from the inverter 47 connected to the range check circuit 38, will pass the rounding circuit output (40) to OR gate 50. The rounding circuit serves to round the input value to the tens value closest to the input value which in the example shown is (40). The OR gate passes the rounded value (40) to the center display window 52 and to the decrementer 42 and incrementer 54 which respectively decrease and increase the received value by ten to display the end values (30) and (50) at windows 54 and 56. The low end value (30) is also passed to the offset evaluator for the arithmetical calculation of the bar display as discussed above.

The midrange value from OR gate 50 is also passed to the storage register 58 which receives the latch pulses from clock 34. Thus a mid subrange value is latched and passed to the range check circuit 38 and to AND gate 60.

The range check circuit serves to compare the monitored input value I with the midrange value D to insure that the former is within the subrange. Specifically, the circuit will check to determine that $(D-10) \leq I < (D+10)$ is satisfied.

In the example shown, a prior midrange (60) is latched in storage register 58 and is passed to the range check circuit This does not satisfy $(D-10) \leq I < (D+10)$, or $50 \leq 43.5 < 70$, resulting in zero level output (0) from circuit 38.

Accordingly, inverter circuit 47 will produce a high level (1) output to the AND gate 46 to permit the output (40) from the rounding circuit to pass to OR gate 50 as discussed above. The zero level (0) output from the range check circuit 38 results in no output from AND gate 60.

Now consider a latched input value I of (33.5) and a midrange value of (40) passing to the range check circuit 38. The input value will be rounded to (30) by the rounding circuit 36 and passed to AND gate 46. The range check circuit will produce a high level output because $(D-10) \leq I < (D+10)$, or $30 \leq 33.5 < 50$, is satisfied. As a result AND gate 46 will not pass the output (30) from the rounding circuit, whereas AND gate 60 will pass output (40) to OR gate 50 resulting in the correct subrange display for the (33.5) value.

If the input value were to drop to (29.5); with a md range value of 40, the range check circuit would not produce a high level output because $(D-10) \leq I < (D+10)$ or $30 \leq 29.5 < 50$ is not satisfied. The AND gate 46 would pass (30) and gate 60 would be blocked from passing (40) to the subrange display circuitry.

Thus it is seen from the above description of a specific embodiment that the input I being monitored is continuously displayed on the correct subrange for the input value. When I changes to require a new subrange, it will usually overlap with the immediately preceeding displayed subrange.

It is understood that the above embodiment is disclosed by way of example. One modification of this embodiment contemplates a similar system wherein only the tens digit place need be retained for much of the circuitry. Thus the rounding circuit output and subsequent circuits would pass along only the tens place and the display device would have fixed zeros for the end and center values.

Throughout FIG. 6 the wide arrows represent sets of conductors whereas single lines represeht single conductors.

Numerous other embodiments and modifications could be constructed within the scope and spirit of the invention as defined in the appended claims.

I claim:

1. A digital display device for indicating the value of a function that may vary in a generally continuous manner comprising:

input means to receive the function to be displayed over a predetermined range of values;

indicator means including a viewing area connected to the input means and operable to provide a visual display of the varying value over said predetermined range of values;

said indicator means including means to dispaly invidually in the viewing area one at a time a plurality of discrete subranges extending over said predetermined range;

means providing each subrange display with a predetermined range of values having upper and lower limit values;

said indicator means including means providing subrange display indicia representing values within the subrange;

said indicator means further including value indicating means;

means to provide relative displacement between a displayed subrange and the value indicating means;

means to render stationary the displayed subrange;

means connected to said input means and to said indicator means to convert said function to a visual display representative of the instantaneous value thereof within the displayed subrange;

memory means to store the value identity of the displayed subrange;

means connected to the input means and to the memory means to control the selection of a displayed subrange;

said selected subrange having successive subranges on either side of its upper and lower limits;

means connected to the input means to select a subrange for a given input value; and means for providing said selected subrange with a value on each side of the said given input value such that the values of the predetermined range of said selected subrange overlaps at least some of the predetermined range of values of at least one of said successive ranges other than the said limit values.

2. A display device as set forth in claim 1 in which the means providing subrange display indicia are fixed at discrete positions in the viewing area separated by spaces in which the value indicating means provide indication of input values by relative displacement from the subrange display indicia and said discrete positions being common to all subranges.

3. A display device as set forth in claim 1 in which the means providing subrange display indicia are comprised of multiple-segment display devices having means to form digits and other symbols.

4. A display device as set forth in claim 1 in which said means connected to the input means and to the memory means selects a subrange for display in accordance with the value of the input means and the subrange value identity in memory means such that when an input value is within the range of the displayed subrange identified by the memory means, that subrange is retained for display.

5. A digital display device for indicating the value of a function that may vary in a generally continuous manner comprising:

input means to receive the function to be displayed over a predetermined range of values;

indicator means including a viewing area connected to the input means and operable to provide a visual display of the varying value over said predetermined range of values;

said indicator means including means to display individually in the viewing area one at a time a plurality of discrete subranges extending over said predetermined range;

means providing each subrange display with a predetermined range of values having upper and lower limit values;

said indicator means including means providing subrange display indicia representing values within the subrange;

said indicator means further including value indicating means;

means to provide relative displacement between a displayed subrange and the value indicating means;

means to render stationary the displayed subrange;

means connected to said input means and to said indicator means to convert said function to a visual display representative of the instantaneous value thereof within the displayed subrange;

memory means to store the value identity of the displayed subrange;

comparison means connected to the input means and to the memory means to control the selection of a displayed subrange;

means connected to the input means to select a subrange for a given input value;

means for providing said selected subrange with a value on each side of the said given input value such that the values of the predetermined range of said selected subrange overlaps with at least some of the predetermined range of values of at least one of the adjacent subranges other than said limit values.

said last named means being responsive to said means connected to the memory means and to the input means.

6. A display device as set forth in claim 5 in which the means providing subrange display indicia are fixed at discrete positions in the viewing area separated by spaces in which the value indicating means provide indication of input values by relative displacement from the subrange display indicia and said discrete positions being common to all subranges.

7. A display device as set forth in claim 5 in which the means providing subrange display indicia are comprised of multiple-segement display devices having means to form digits and other symbols.

8. A display device as set forth in claim 5 in which said means connected to the input means and to the memory means selects a subrange for display in accordance with the value of the input means and the subrange value identity in the memory means such that when an input value is within the range of the displayed subrange identified by the memory means, that subrange is retained for display.

* * * * *